United States Patent [19]

Madison et al.

[11] 3,952,216

[45] Apr. 20, 1976

[54] MULTIPLE-FREQUENCY TRANSDUCER

[75] Inventors: Theodore C. Madison, Goleta, Calif.; Harlan G. Frey, Austin, Tex.

[73] Assignee: The United States of America as represented by the Secretary of the Navy, Washington, D.C.

[22] Filed: Apr. 4, 1975

[21] Appl. No.: 565,174

[52] U.S. Cl. .................................. 310/9.1; 310/8.2; 310/8.3; 310/8.7; 310/9; 340/9; 340/10

[51] Int. Cl.² .......................................... H01L 41/08

[58] Field of Search ............... 310/8.2, 8.3, 8.4, 8.7, 310/8.9, 9, 9.1, 26; 340/8, 8 MM, 8 LF, 9, 10, 11

[56] References Cited

UNITED STATES PATENTS

| | | | |
|---|---|---|---|
| 2,723,386 | 11/1955 | Camp | 310/26 X |
| 2,802,196 | 8/1957 | Fry et al. | 310/9.1 UX |
| 2,829,361 | 4/1958 | Crandell et al. | 340/10 |
| 3,478,309 | 11/1969 | Massa, Jr. | 340/9 |
| 3,890,591 | 6/1975 | Bocquillon et al. | 310/8.1 X |

*Primary Examiner*—Mark O. Budd
*Attorney, Agent, or Firm*—R. S. Sciascia; R. F. Beers; S. Scheinbein

[57] ABSTRACT

A transducer comprising an array of prestressed, mass-loaded, piezoelectric, low-frequency, transducer elements set within a housing, a thin alignment plate bonded to the planar radiating faces of the low-frequency transducer array, a pressure-release sheet bonded to the thin alignment plate, and a high frequency, planar, transducer array bonded to this pressure-release sheet. The high frequency transducer array in combination with its two backing layers forms an integral part of the low frequency transducer array during low frequency operation in addition to providing high frequency transmission and reception during high frequency operation. This transducer construction permits high transmitting and receiving sensitivities at widely separated frequencies.

5 Claims, 2 Drawing Figures

MULTIPLE-FREQUENCY TRANSDUCER

FIELD OF THE INVENTION

This invention relates generally to electromechanical transducers and in particular to a multi-frequency transducer that has high transmitting and receiving sensitivities at widely separated frequencies.

DESCRIPTION OF THE PRIOR ART

There are a wide variety of transducer applications where both high-frequency and low-frequency signals are required. For example, one type of sonar system, the nonlinear acoustic sonar, operates by simultaneously transmitting two high-frequency signals from a transducer array which mix in the water to form a low-frequency signal (the difference in frequency of the two high-frequency signals). The low-frequency signal propagates to targets and is reflected or scattered back to the sonar transducer. In order to achieve the desired, long, target-detection ranges, the transmitting sensitivity of the sonar transducer at the high frequencies must be high and the receiving sensitivity at the low frequency must be high. Thus a transducer is required which has high transmitting and receiving sensitivities at widely separated frequencies.

Generally, electroacoustic transducers are narrow band, i.e., they exhibit high sensitivity only over a relatively narrow band of frequencies. A transducer that is designed to have high sensitivity at high frequencies generally has a low sensitivity at low frequencies, and vice versa. Most transducers can be modified to have a more uniform sensitivity over a broad range of frequencies, but only at the expense of sensitivity at all frequencies. For a nonlinear acoustic sonar where the low frequency might be from one half to one fiftieth of the high frequencies, the technique of broadening the frequency response at the expense of sensitivity is not practical because the transmitted sound pressure level at the difference frequency is much too low (due to the low conversion efficiency of the mixing process) and the sensitivity of the transducer is too degraded. These disadvantages severely limit the sonar range capability.

Thus, in applications requiring high transducer sensitivities at widely separated frequencies, two separate transducer arrays must be used. Clearly these transducer assemblies cannot be used in space-premium environments where the size of such transducer assemblies is critical.

SUMMARY OF THE INVENTION

Briefly, the transducer of the present invention obviates the requirement for two separate arrays where high transducer sensitivity is required at widely separated frequencies. The transducer comprises an array of low frequency, acoustic, transducer elements with their transducer faces set in one plane, a mass loading means attached to said low-frequency array for lowering the resonant frequency of this array to a desired frequency, and a high-frequency planar array of transducer elements with an alignment plate and a thin sheet of pressure-decoupling material forming a backing which overlays the low-frequency array. This alignment plate-decoupling material and the high frequency array comprises additional mass loading for said low-frequency array. The high frequency array effectively becomes the radiating acoustic face for said low-frequency array. The thin pressure-decoupling material is of a proper thickness and composition to decouple the low and high-frequency arrays of the transducer at high frequencies while being essentially acoustically transparent at low frequencies.

OBJECTS OF THE INVENTION

An object of the present invention is to reduce the size of multi-frequency, transducer housings.

A further object is to make a unitary, compact, transducer assembly that has high transmitting and receiving sensitivities at widely separated frequencies.

Other objects, advantages, and novel features of the present invention will become apparent from the following detailed description of the invention when considered in conjunction with the accompanying drawings.

DETAILED DESCRIPTION OF THE INVENTION

Figure 1:
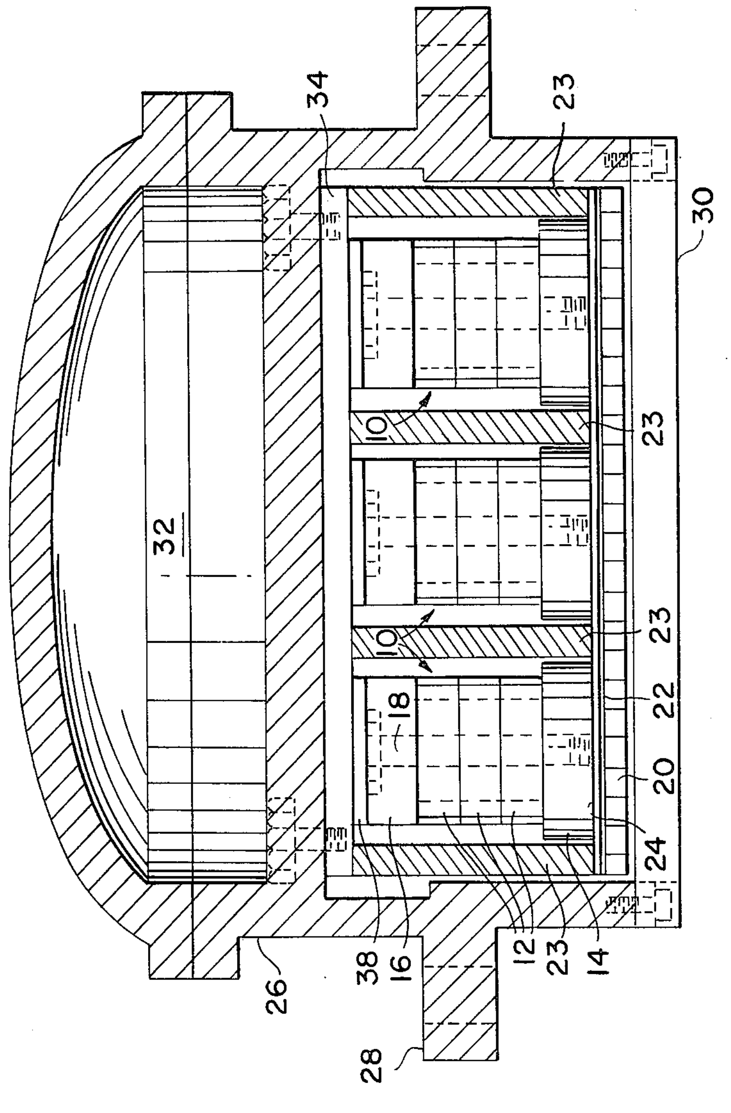
FIG. 1 is a sectioned, side view of one embodiment of the transducer of the present invention.

Referring now to the drawings, FIG. 1 is a cross-sectional view of the multiple-frequency transducer. The blocks 10 represent the array of low-frequency elements. There is no restriction to any particular type of low-frequency element but, by way of example, a hollow, longitudinal vibrator is shown in the figure. It is formed of four transducer cylinders electroded and bonded together using conventional techniques to form a unitary element 10. The individual transducer cylinders 12 may be formed from piezoelectric material such as lead zirconate titanate or from magnetostrictive material. A typical, commerical, low-frequency transducer that could be used in this application is the MODEL ITC — 3001 made by International Transducer Corporation.

In order to obtain the desired, low-frequency, sensitivity range for the low-frequency transducer 10, the transducer elements 12 are prestressed and mass-loaded. This technique involves adding mass, usually blocks of dense metal, referred to as the head mass 14 and the tail mass 16, to the top and bottom of the stack of transducer elements 12 and then binding the metal blocks 14 and 16 and the transducer stack together under stress to achieve high sensitivity at the desired low frequency. This stressed mass loading reduces the natural frequency of longitudinal-mode resonance of the transducer stacks 10 thus substantially reducing the length of transducer required to obtain resonance in the desired low-frequency ranges. In the present embodiment, the low-frequency elements are prestressed to a value of 5,000 to 6,000 psi in both the longitudinal and circumferential directions. The circumferential prestress, is provided by a fiberglass wrapping of the ceramic stacks 10. The longitudinal prestress is provided by a compliant prestress bolt 18. It should be understood that the precise means for adding stress to the mass-loaded, transducer stack 10 is not critical and any conventional stress device could be utilized.

The high-frequency, transducer array is formed by a mosaic of small transducer blocks fabricated to have their natural mechanical resonance at the desired frequency of maximum sensitivity. This high-frequency, mosaic array is bonded to a thin sheet of pressure-release material 22 which is in turn bonded to a thin alignment plate 24 which serves as a flat alignment plane for the small high frequency elements 20. The alignment plate 24 is bonded to a support structure 23 into which the mass loaded low frequency elements are inserted. The acoustic coupling between the low frequency elements and the alignment plate is through a very thin oil film between the low frequency element head masses and the alignment plate. Any of the well-known bonding techniques may be utilized such as, for example, epoxy adhesive bonding.

The unusual feature of this design is that the mass of the high-frequency elements 20 and their backing sheets 22 and 24 form a portion of the head mass 14. Essentially, the mass of the high-frequency elements and their backing materials 22 and 24 substitute for part of the head mass 14 in the conventional design of the low-frequency stacks 10. Thus the high-frequency assembly is an integral part of the low-frequency array. Due to this integrality of the high-frequency mosaic in the low-frequency assembly, the high frequency array forms the radiating face for the low-frequency stacks 10 during low frequency transmission.

The pressure decoupling sheet 22 to which the high-frequency array is bonded has the proper thickness and composition to decouple the low- and high-frequency (HF) portions of the transducer at high frequency and thus to provide effective pressure release to the rear face of the HF array. This design thus isolates the HF array from the LF array at high frequency.

At the same time however, the thickness and composition of the decoupling sheet 22 are chosen such that the sheet 22 in combination with the HF array and the alignment plate 24 is essentially transparent at the low frequency of interest so that low-frequency, acoustic waves incident on the high-frequency array are coupled directly to the low-frequency array. (If the thickness of the sheet 24 is a significant portion of a high frequency wavelength of interest (approximately one fourth wavelength thick) then it acts as a barrier to sound in this wavelength range. At the same time the thickness of the sheet 24 may be only 1/10 or 1/20 of the lower frequency wavelengths. Thus the sheet is transparent in this range of frequencies. By way of example, the thin pressure release sheet 22 may be 0.03 inches to 0.06 inches in thickness in order to effect a proper decoupling at high frequencies in the range of 50 KHz to 1 MHz while not materially affecting low-frequency performance in the range of 1.0 KHz to 50 KHz. Any of the well-known decoupling materials may be used such as, for example, chloroprene or polyurethane.

The thin alignment plate 24 is inserted for the purpose of aligning all the elements 20 together so that the piezoelectric or magnetostrictive material of the high-frequency array is vibrated in unison across the diameter so as to provide an essentially circular, piston-radiating face at low frequencies. Thus, this plate 24 must be thick enough so that it provides a rigid alignment plane, yet, it must be thin enough so that it is acoustically transparent at the low frequencies of interest. For example, a thickness on the order of 50 thousandths of an inch has the desired characteristics for low frequencies in the range of 1 KHz to 50 KHz. Thus this design allows the high frequency elements 22 to form the radiating face for both transmission and reception at the low-frequency, transducer stacks 10.

This multiple-frequency, transducer assembly is set on a mounting plate 34 in a housing 26 which provides protection against pressure, shock and other environmental factors. A pressure-release section 38 may be used to decouple the vibrator stacks 10 from the baseplate 34. The shape, size, or construction of housing 26 is not critically important to the operation of the transducer and is usually dependent on mounting requirements. The housing, by way of example, may be made of steel.

The housing 28 has a flange 28 on each side for installation. A housing wall extends across the face of the high-frequency, mosaic array for mechanical protection and comprises a pressure membrane 30. In the present embodiment a no-foul, rubber window is used although this is not critical. The volume 32 is for housing the electronic, impedance-matching and amplifying equipment. The complete, internal volume of the housing 26 may be filled with an oil or other suitable liquid to provide pressure equalization if good pressure characteristics are required.

Figure 2:
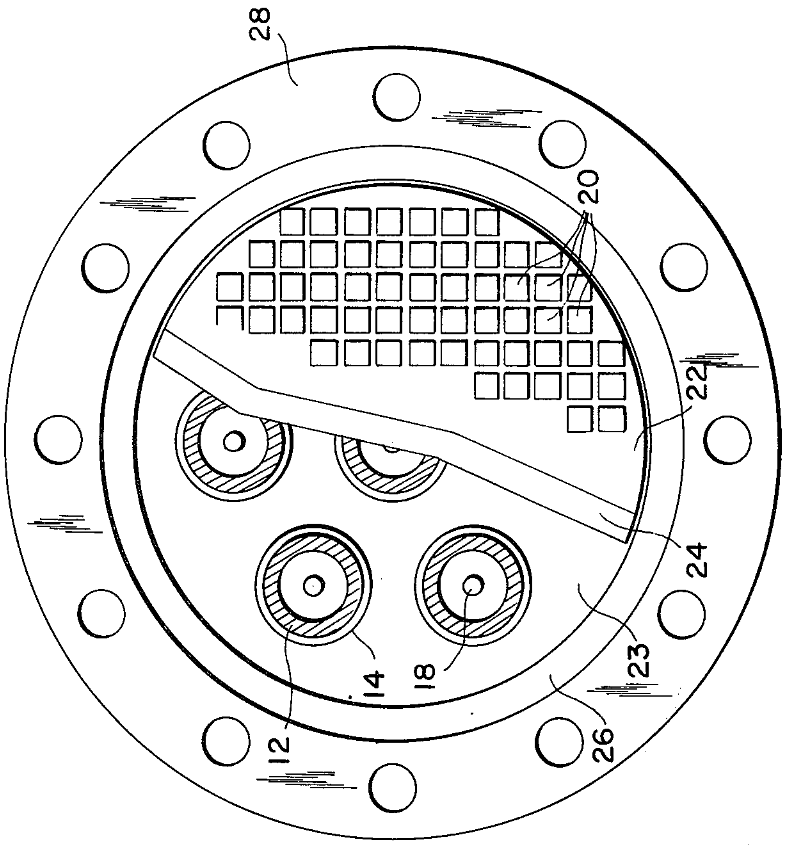
FIG. 2 is a top, partially sectioned view of the embodiment shown in FIG. 1.

FIG. 2, a top, partially sectioned view is provided to more clearly illustrate the transducer of the present invention.

This transducer operates in the well-known manner to effect transmissions and receptions. In a high-frequency transmission mode an alternating electrical voltage is applied to the electrode of each of the high-frequency elements causing them to expand or contract in sympathy with this voltage. This expansion and contraction sets up a mechanical vibration which creates an acoustic wave. If two high frequencies are to be simultaneously transmitted, two, different, alternating, electrical voltages are used. Each voltage is applied to a different set of transducer elements forming the high-frequency, mosaic array.

In a low-frequency transmission mode the alternating electrical voltage is applied to the electrodes of the low-frequency elements causing them to expand or contract in sympathy with this voltage to set up a mechanical vibration. This mechanical vibration is transmitted to the high-frequency array. The high-frequency array acts as the radiating face of the low-frequency array by setting up the acoustic wave from said low-frequency array.

In a reception mode, when an acoustic wave impinges on the window 30, it is coupled through the high frequency array and backing plates to the low frequency stacks 10 where an alternating voltage is generated in sympathy with the acoustic wave.

Obviously, many modifications and variations of the present invention are possible in light of the above teachings. It is therefore to be understood that, within the scope of the appended claims, the invention may be practiced otherwise than as specifically described.

What is claimed is:

1. A multi-frequency, acoustic transducer comprising:
low-frequency, planar, transducer-array means;
mass-loading means physically attached to said low-frequency means for lowering the resonant frequency of said low-frequency means;
pressure-decoupling sheet means coupled to the combination of said low-frequency array means and said mass-loading means; and
high frequency, planar, transducer-array means for transmitting and receiving high frequencies during high frequency operation and for mass-loading said low-frequency array means and for forming the radiating face for said low-frequency array means during low-frequency operation bonded to said pressure-decoupling means;

said pressure-decoupling means being of the proper thickness and composition to decouple the low and the high frequency array means at high frequencies while being essentially acoustically transparent at low frequencies.

2. A multi-frequency transducer as defined in claim 1 wherein said high and low frequency array means are comprised of piezoelectric, array elements.

3. A multi-frequency transducer as defined in claim 1 wherein said high and low frequency array means are comprised of magnetostrictive, array elements.

4. A multi-frequency transducer as defined in claim 1 wherein said mass-loading means comprises:

head mass means attached to the head of each element of said low frequency array means;

tail mass means attached to the tail of each element of said low frequency array means; and stress means for holding said mass means and the element of said low frequency array means together under stress.

5. A multi-frequency transducer as defined in claim 1 wherein said pressure-decoupling means comprises:

pressure release sheet means for decoupling the high and low frequency arrays; and alignment sheet means for providing a flat alignment plane for the elements of said high frequency, planar, array means.

* * * * *